United States Patent
Kim et al.

(10) Patent No.: US 9,520,186 B2
(45) Date of Patent: Dec. 13, 2016

(54) ELECTRONIC DEVICE

(71) Applicant: SK HYNIX INC., Icheon (KR)

(72) Inventors: Hyo-June Kim, Icheon (KR); Ja-Chun Ku, Icheon (KR); Sung-Kyu Min, Icheon (KR); Seung-Beom Baek, Icheon (KR); Byung-Jick Cho, Icheon (KR); Won-Ki Ju, Icheon (KR); Hyun-Kyu Kim, Icheon (KR); Jong-Chul Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 547 days.

(21) Appl. No.: 14/176,024

(22) Filed: Feb. 7, 2014

(65) Prior Publication Data

US 2015/0089087 A1 Mar. 26, 2015

(30) Foreign Application Priority Data

Sep. 25, 2013 (KR) .................. 10-2013-0113869

(51) Int. Cl.
*G06F 3/06* (2006.01)
*G06F 13/28* (2006.01)
*G11C 13/00* (2006.01)
*H01L 27/24* (2006.01)
*H01L 45/00* (2006.01)

(52) U.S. Cl.
CPC ....... *G11C 13/0023* (2013.01); *G11C 13/0002* (2013.01); *G11C 13/0007* (2013.01); *H01L 27/2418* (2013.01); *H01L 27/2472* (2013.01); *H01L 27/2481* (2013.01); *G11C 2213/71* (2013.01); *G11C 2213/78* (2013.01); *H01L 45/08* (2013.01); *H01L 45/1233* (2013.01); *H01L 45/146* (2013.01)

(58) Field of Classification Search
None
See application file for complete search history.

(56) References Cited

U.S. PATENT DOCUMENTS

| 8,565,004 B2* | 10/2013 | Iijima | ............ | G11C 11/5685 |
| | | | | 365/148 |
| 2009/0140233 A1* | 6/2009 | Kinoshita | ............ | G11O 5/02 |
| | | | | 257/4 |
| 2013/0314975 A1* | 11/2013 | Katayama | ............ | H01L 27/101 |
| | | | | 365/148 |
| 2014/0293685 A1* | 10/2014 | Noguchi | ............ | G11C 11/1675 |
| | | | | 365/158 |

FOREIGN PATENT DOCUMENTS

KR 10-2004-0049288 A 6/2004

\* cited by examiner

*Primary Examiner* — Idriss N Alrobaye
*Assistant Examiner* — Dayton Lewis-Taylor

(57) ABSTRACT

A semiconductor memory may include: a first stacked structure including a first word line disposed over a substrate and extended in a first direction, a first bit line disposed over the first word line and extended in a second direction crossing the first direction, and a first variable resistance layer interposed between the first word line and the first bit line; and a second stacked structure including a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line.

22 Claims, 10 Drawing Sheets

ELECTRONIC DEVICE

CROSS-REFERENCE TO RELATED APPLICATION

The present application claims priority of Korean Patent Application No. 10-2013-0113869, entitled "ELECTRONIC DEVICE" and filed on Sep. 25, 2013, which is incorporated by reference in its entirety herein.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), a FRAM (ferroelectric random access memory), a MRAM (magnetic random access memory), an E-fuse, etc.

SUMMARY

Embodiments relate to an electronic device capable of simplifying a fabrication process, thereby reducing production cost and increasing an integration degree.

In one aspect, there is provided an electronic device including a semiconductor memory. The semiconductor memory may include: a first stacked structure including a first word line disposed over a substrate and extended in a first direction, a first bit line disposed over the first word line and extended in a second direction crossing the first direction, and a first variable resistance layer interposed between the first word line and the first bit line; and a second stacked structure including a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line.

Implementations of the above device may include one or more of the following.

The first variable resistance layer and the first selecting element layer form a first memory cell, and the second variable resistance layer and the first selecting element layer form a second memory cell. The first memory cell is controlled by the first word line and the second bit line, and the second memory cell is controlled by the second word line and the first bit line. The first bit line is floated when the first memory cell is controlled, and the second bit line is floated when the second memory cell is controlled. The first selecting element layer is formed of $NbO_2$. Each of the first variable resistance layer and the second variable resistance layer comprises a structure in which an oxygen-poor metal oxide layer and an oxygen-rich metal oxide layer are stacked, and the first variable resistance layer and the second variable resistance layer are symmetrical with each other, with the first selecting element layer interposed therebetween. The first variable resistance layer has an island shape at an intersection between the first word line and the first bit line. The first variable resistance layer has the same line shape as the first word line or the first bit line. The second variable resistance layer has an island shape at an intersection between the second word line and the second bit line. The second variable resistance layer has the same line shape as the second word line or the second bit line. The first selecting element layer has an island shape while overlapping an intersection between the first bit line and the first word line and an intersection between the second bit line and the second word line. The first selecting element layer has the same line shape as at least one of the first bit line and the second bit line. One or more of the first variable resistance layer, the second variable resistance layer, and the first selecting element have a plate shape. An end part of the first bit line protrudes in the second direction more than an end part of the second bit line, and the semiconductor memory further comprises: a first contact disposed over the protruding end part of the first bit line so as to be coupled to the first bit line; and a second contact disposed over the end part of the second bit line so as to be coupled to the second bit line. The semiconductor memory further comprises: a third stacked structure disposed over the second stacked structure and comprising the second word line, a third bit line disposed over the second word line and extended in the second direction, and a third variable resistance layer interposed between the second word line and the third bit line; a fourth stacked structure disposed over the third stacked structure, and comprising a fourth bit line extended in the second direction, a third word line disposed over the fourth bit line and extended in the first direction, and a fourth variable resistance layer interposed between the third word line and the fourth bit line; and a second selecting element layer interposed between the third stacked structure and the fourth stacked structure.

In another aspect, there is provided an electronic device including a semiconductor memory. The semiconductor memory may include: first and second word lines extended in a first direction; first and second bit lines extended in a second direction crossing the first direction; a first variable resistance element having both ends coupled to the first word line and the first bit line; a second variable resistance element having both ends coupled to the second word line and the second bit line; and a selecting element coupled in series to the first variable resistance element and the second variable resistance element, while both ends thereof are coupled between the first bit line and the second bit line.

Implementations of the above device may include one or more of the following.

The first variable resistance element and the selecting element form a first memory cell, and the second variable resistance element and the selecting element form a second memory cell. The first memory cell is controlled by the first word line and the second bit line, and the second memory cell is controlled by the second word line and the first bit line. The first bit line is floated when the first memory cell is controlled, and the second bit line is floated when the second memory cell is controlled.

One of the electronic devices may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

One of the electronic devices may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

One of the electronic devices may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

One of the electronic devices may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

One of the electronic devices may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the following description with reference to the accompanying drawings.

DETAILED DESCRIPTION

Figure 1:
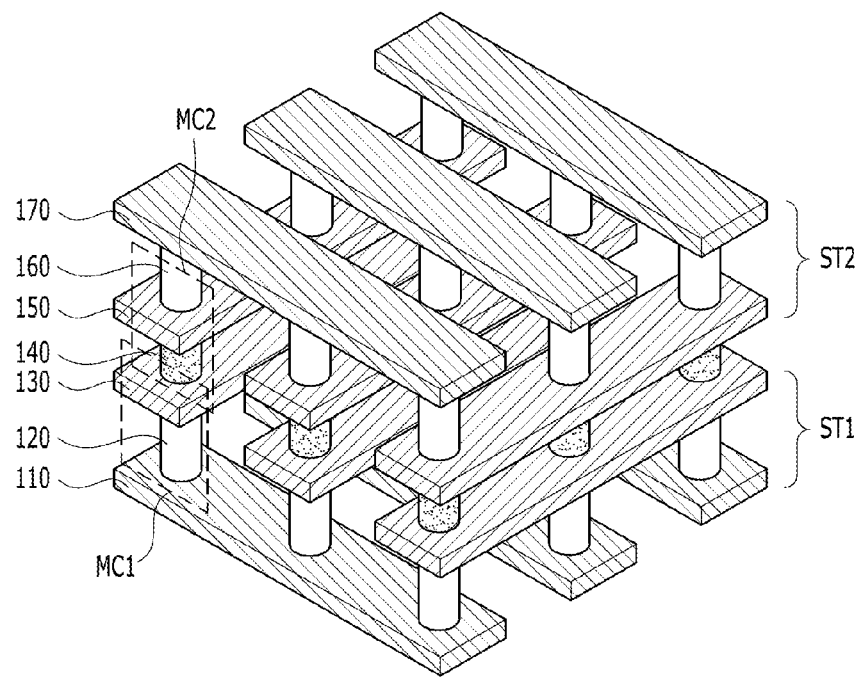
FIG. 1 is a perspective view of a memory device in accordance with one particular implementation.

Various examples and implementations are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in the drawings or description having two or more layers in a multi-layer structure, the relative positioning relationship of such layers or the sequence of arranging the layers as shown reflects a particular implementation for the particular embodiment described or illustrated. However, a different relative positioning relationship or sequence of arranging the layers may be possible. In addition, a described or illustrated example of a multi-layer structure may not reflect all layers present in that particular multilayer structure. That is, one or more additional layers may be further present between two illustrated layers. As a specific example, when a first layer in a described or illustrated multi-layer structure is referred to as being "on" or "over" a second layer or "on" or "over" a substrate, the first layer may be directly formed on the second layer or the substrate or one or more other intermediate layers may exist between the first layer and the second layer or the substrate.

FIG. 1 is a perspective view of a memory device in accordance with an implementation.

Referring to FIG. 1, the memory device may include a first stacked structure ST1, a second stacked structure ST2, and a first selecting element 140. The first stacked structure ST1 includes a first word line 110 disposed over a substrate (not illustrated) and extended in a first direction, a first bit line 130 disposed over the first word line 110 and extended in a second direction crossing the first word line 110, and a first variable resistance element 120 interposed between the first word line 110 and the first bit line 130 at the intersection between the first word line 110 and the first bit line 130. The second stacked structure ST2 includes a second bit line 150 disposed over the first stacked structure ST1 and extended in the second direction, a second word line 170 disposed over the second bit line 150 and extended in the first direction, and a second variable resistance element 160 interposed between the second bit line 150 and the second word line 170 at the intersection between the second bit line 150 and the second word line 170. The first selecting element 140 is interposed between the first bit line 130 and the second bit line 150 and formed to overlap the first and second variable resistance elements 120 and 160, when seen from the top. The first bit line 130 and the second bit line 150 may overlap each other, and the first word line 110 and the second word line 170 may overlap each other.

The first word line 110 and the second bit line 150 may serve to supply a current or voltage to the first variable resistance element 120, and the first bit line 130 and the second word line 170 may serve to supply a current or voltage to the second variable resistance element 160. The first word line 110, the first bit line 130, the second bit line 150, and the second word line 170 may be formed of a monolayer or multilayer including various conductive materials, for example, metals such as Pt, Ir, Ru, Al, Cu, W, Ti, and Ta, or metal nitrides such as TiN, TaN, WN, and WoN. For convenience of description, the line extending in the first direction is referred to as a word line, and the line extending in the second direction is referred to as a bit line.

The first and second variable resistance elements 120 and 160 have a characteristic of switching between different resistance states according to a current or voltage supplied through both ends thereof. According to the resistance state of the first and second variable resistance elements 120 and 160, data '0' or '1' may be stored. Each of the first and second variable resistance elements 120 and 160 may include a monolayer or multilayer including a material used for RRAM, PRAM, MRAM, FRAM and the like. That is, each of the first and second variable resistance elements 120 and 160 may include a metal oxide such as perovskite-based oxide or transition metal oxide, a phase change material such as chalcogenide compound, a ferroelectric material, or a ferromagnetic material.

Figure 5:
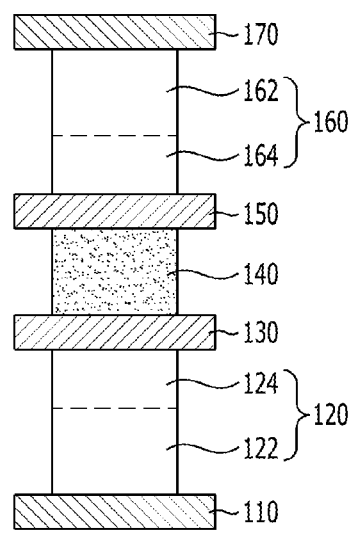
FIG. 5 is a cross-sectional view for explaining a variable resistance element of FIG. 1.

For example, as illustrated in FIG. 5, the first variable resistance element 120 may include a double layer of an oxygen-poor metal oxide layer 122 and an oxygen-rich metal oxide layer 124, and the second variable resistance element 160 may include a double layer of an oxygen-poor metal oxide layer 162 and an oxygen-rich metal oxide layer 164. The oxygen-poor metal oxide layers 122 and 162 may include a layer of which the oxygen content is smaller than the stoichiometric ratio, such as $TiO_x$ (x<2) or $TaO_y$ (y<2.5), and the oxygen-rich metal oxide layers 124 and 164 may include a layer which satisfies the stoichiometric ratio, such as $TiO_2$ or $Ta_2O_5$. Depending on whether or not oxygen vacancies of the oxygen-poor metal oxide layers 122 and 162 are supplied to the oxygen-rich metal oxide layers 124 and 164, respectively, and whether or not a filament current path is formed in the oxygen-rich metal oxide layers 124 and 164 by the oxygen vacancies, the resistance of the first and second variable resistance elements 120 and 160 may switch between a high resistance state and a low resistance state. As described above, however, embodiments are not limited thereto, and the first and second variable resistance elements 120 and 160 may include a structure having a characteristic of switching between different resistance states according to a voltage or current applied across the structure. Furthermore, the first and second variable resistance elements 120 and 160 may be disposed to be symmetrical with each other, with the first selecting element 140 interposed therebetween. That is, as illustrated in FIG. 5, when the oxygen-poor metal oxide layer 122 is positioned at a lower part of the first variable resistance element 120 and the oxygen-rich metal oxide layer 124 is positioned at an upper part of the first variable resistance element 120, the oxygen-poor metal oxide layer 162 may be positioned at an upper part of the second variable resistance element 160 and the oxygen-rich metal oxide layer 164 may be positioned at a lower part of the second variable resistance element 160. In another implementation, the oxygen-poor metal oxide layer 122 may be positioned at the upper part of the first variable resistance element 120, and the oxygen-rich metal oxide layer 124 may be positioned at the lower part of the first variable resistance element 120. In this case, the oxygen-poor metal oxide layer 162 may be positioned at the lower part of the second variable resistance element 160 and the oxygen-rich metal oxide layer 164 may be positioned at the upper part of the second variable resistance element 160.

The first and second variable resistance elements 120 and 160 may have an island shape, and may be disposed at the intersection between the first word line 110 and the first bit line 130 and the intersection between the second bit line 150 and the second word line 170, respectively. However, the first and second variable resistance elements 120 and 160 may have various shapes, as described below with reference to FIGS. 8 and 9.

The first selecting element 140 may control current supply to the second variable resistance element 160 or the first variable resistance element 120 according to a voltage applied to the first bit line 130 or the second bit line 150. For this operation, the first selecting element 140 may pass little current at a predetermined threshold voltage or less, and pass a predetermined level of current required for switching of the first and second resistance elements 120 and 160 at above the predetermined threshold voltage. The first selecting element 140 may include a diode, a transistor, a tunnel barrier, a metal-insulator transition (MIT) element and the like. In an embodiment, the first selecting element 140 may be formed of $NbO_2$. Furthermore, the first selecting element 140 may have an island shape, and may overlap the first variable resistance element 120 and the second variable resistance element 160. However, the shape of the first selecting element 140 may be changed in various manners, as described below with reference to FIGS. 6 and 7.

The first selecting element 140 is now discussed. In a cross-point structure in which a variable resistance element is disposed between a word line and a bit line crossing each other, like the first or second stacked structure ST1 or ST2, unselected memory cells may be inevitably coupled to a word line and a bit line which are coupled to a selected memory cell. That is, unselected memory cells share the word line or bit line with the selected memory cell. Therefore, when the first selecting element 140 is not provided, leakage current may flow from the selected memory cell to the unselected memory cells through the shared the word line or bit line. As the first selecting element 140 is disposed to be coupled in series to each of the first and second variable resistance elements 120 and 160, it is possible to suppress the leakage current.

According to certain embodiments, as the first selecting element 140 is interposed between the first bit line 130 and the second bit line 150, the first selecting element 140 may be coupled in series to the first variable resistance element 120 with the first bit line 130 interposed therebetween, and simultaneously coupled in series to the second variable resistance element 160 with the second bit line 150 interposed therebetween. In other words, one first selecting element 140 may be shared by the first variable resistance element 120 and the second variable resistance element 160 which are disposed at the top and bottom of the first selecting element 140, respectively.

The first variable resistance element 120 and the first selecting element 140 coupled in series to the first variable resistance element 120 may be collectively referred to as a first memory cell MC1, and the second variable resistance element 160 and the first selecting element 140 coupled in series to the second variable resistance element 160 may be collectively referred to as a second memory cell MC2. As described below, the first memory cell MC1 may be controlled by the first word line 110 and the second bit line 150, and the second memory cell MC2 may be controlled by the first bit line 130 and the second word line 170. While the first memory cell MC1 is controlled, the first bit line 130 interposed between the first selecting element 140 and the first variable resistance element 120 may float. While the second memory cell MC2 is controlled, the second bit line 150 interposed between the first selecting element 140 and the second variable resistance element 160 may float.

The memory device of FIG. 1 may be fabricated by repetitively depositing and patterning material layers forming the first word line 110, the first variable resistance element 120, the first bit line 130, the first selecting element 140, the second bit line 150, the second variable resistance element 160, and the second word line, respectively. This method may be easily understood from FIG. 1, and thus the detailed descriptions thereof are omitted herein.

Figure 2:
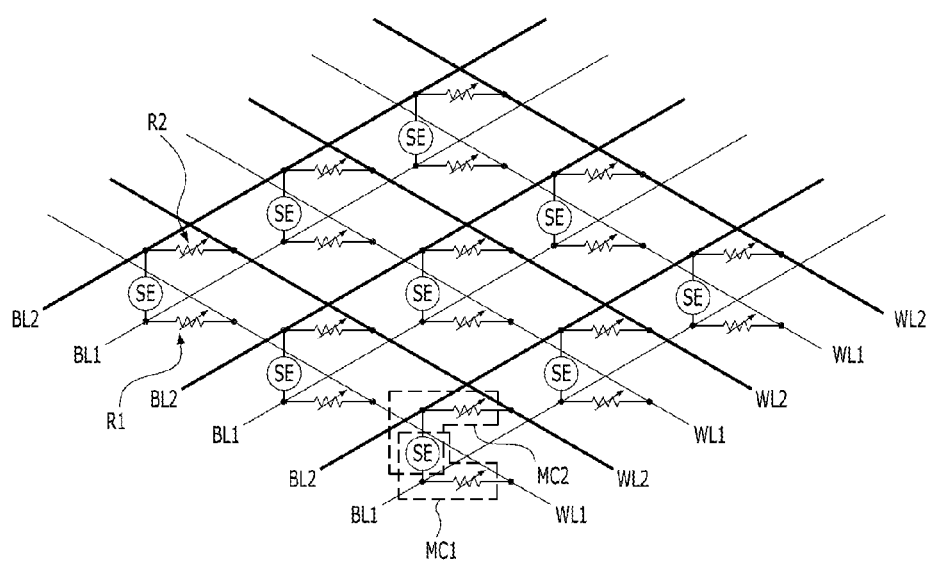
FIG. 2 is a circuit diagram corresponding to FIG. 1.

FIG. 2 is a circuit diagram corresponding to FIG. 1.

Referring to FIG. 2, first and second word lines WL1 and WL2 extended in the first direction, and first and second bit lines BL1 and BL2 extended in the second direction, may be arranged.

A first variable resistance element R1 may be coupled between the first word line WL1 and the first bit line BL1, and a second variable resistance element R2 may be coupled between the second word line WL2 and the second bit line BL2. Furthermore, a selecting element SE may be coupled between the first bit line BL1 and the second bit line BL2. The selecting element SE may be coupled in series between one end of the first variable resistance element R1 and one end of the second variable resistance element R2.

The first variable resistance element R1 and the selecting element SE may form a first memory cell MC1, and the second variable resistance element R2 and the selecting element SE may form a second memory cell MC2. Thus, the first and second memory cells MC1 and MC2 may share the selecting element SE.

One end of the first memory cell MC1 may be coupled to the first word line WL1, and the other end of the first memory cell MC1 may be coupled to the second bit line BL2. Thus, the first memory cell MC1 may be controlled by the first word line WL1 and the second bit line BL2. One end of the second memory cell MC2 may be coupled to the second word line WL2, and the other end of the second memory cell MC2 may be coupled to the first bit line BL1. Thus, the second memory cell MC2 may be controlled by the second word line WL2 and the first bit line BL1.

Hereafter, an operating method of the above-described memory device will be described with reference to FIGS. 3 and 4.

Figure 3:
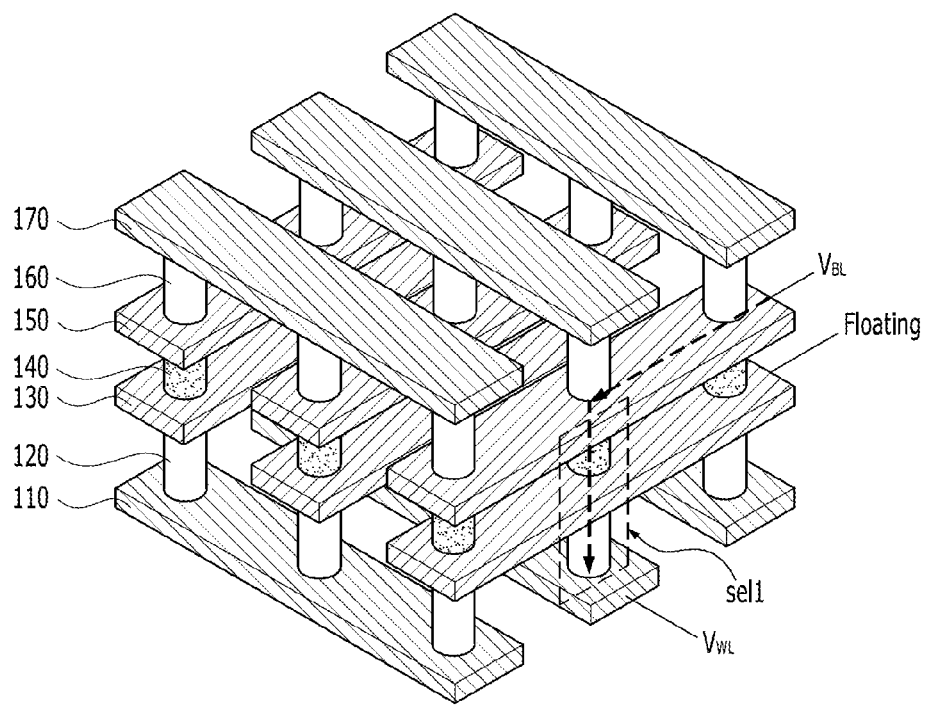
FIGS. 3 and 4 are diagrams explaining an operating method of the memory device of FIG. 1.

FIG. 3 is a diagram explaining an operation of storing data into a selected first memory cell sel1 among first memory cells MC1 or reading data stored in the selected first memory cell sel1.

Referring to FIG. 3, a required word line voltage $V_{WL}$ and a required bit line voltage $V_{BL}$ may be applied to the first word line 110 and the second bit line 150 which are coupled to the selected first memory cell sel1, respectively, in order to perform a write operation or read operation on the selected first memory cell sel1. At this time, 0V may be applied to the first word line 110 and the second bit line 150 which are not coupled to the selected first memory cell sel1.

The first bit line 130 interposed between the first variable resistance element 120 and the first selecting element 140 may be floated to prevent the first bit line 130 from interrupting the operation for the selected first memory cell sel1.

In FIG. 3, a dotted arrow indicates a current flow during this process. In an embodiment, the current flow direction shown by the arrow in FIG. 3 may be different. For example, the current may flow in a reverse direction from that shown in FIG. 3.

Figure 4:
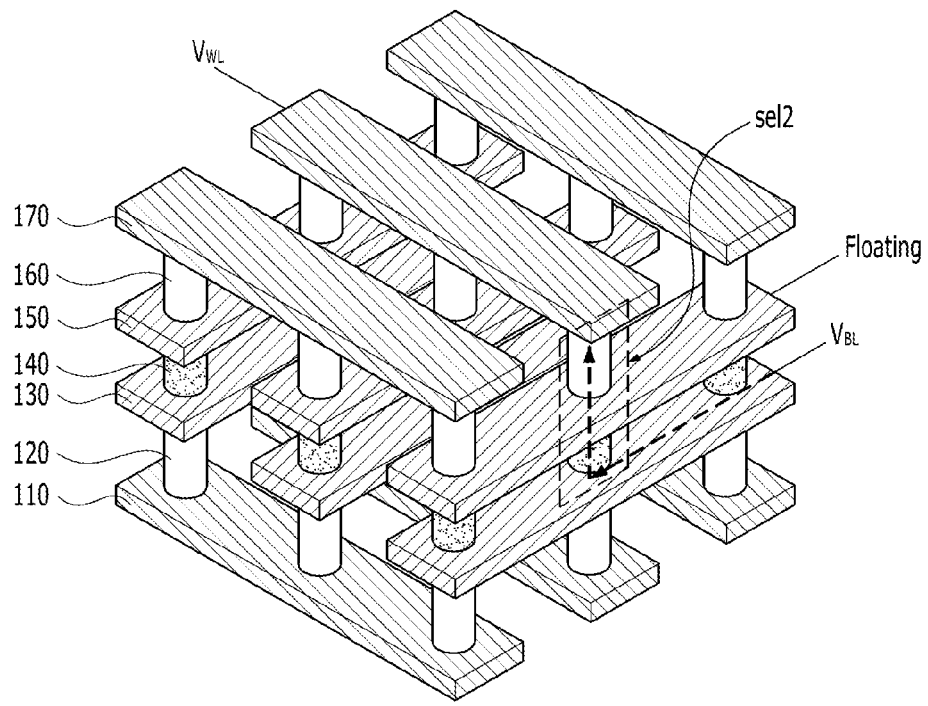

FIG. 4 is a diagram for explaining an operation of storing data into a selected second memory cell sel2 among second memory cells MC2 or reading data stored in the selected second memory cell sel2.

Referring to FIG. 4, a required word line voltage $V_{WL}$ and a required bit line voltage $V_{BL}$ may be applied may be applied to the second word line 170 and the first bit line 130 which are coupled to the selected second memory cell sel2, respectively, in order to perform a write operation or read operation on the selected second memory cell sel2. Furthermore, 0V may be applied to the second word line 170 and the first bit line 150 which are not coupled to the selected second memory cell sel2.

The second bit line 150 interposed between the second variable resistance element 160 and the first selecting element 140 may be floated to prevent the second bit line 150 from interrupting the operation for the selected second memory cell sel2.

In FIG. 4, a dotted arrow indicates a current flow during this process. In an embodiment, the current flow direction shown by the arrow in FIG. 4 may be different. For example, the current may flow in a reverse direction from that shown in FIG. 4.

When the above-described memory device is employed, a level of difficulty in fabrication may be reduced, the fabrication process may be simplified, and an integration degree of the device may be increased, compared to a conventional semiconductor device where two or more cross-point structures are stacked.

Specifically, in the conventional semiconductor device, a variable resistance element and a selecting element coupled in series to each other are interposed between a word line and a bit line crossing each other. In particular, an intermediate electrode is also interposed between the variable resistance element and the selecting element, in order to prevent an unnecessary reaction between the variable resistance element and the selecting element. Thus, convention approaches have experienced difficulties in collectively patterning the variable resistance element and the selecting element (or the variable resistance element, the intermediate electrode, and the selecting element when the intermediate electrode is included), because the variable resistance element and the selecting element have a large thickness. In accordance with embodiments, however, patterning may be easily performed because the variable resistance element and the selecting element are separately formed. Furthermore, in the conventional semiconductor device, the selecting element is formed in each cross-point structure. According to embodiments, however, since two cross-point structures share one selecting element, one selecting element formation process may be omitted to simplify the fabrication process. Furthermore, since the entire thickness of the device is reduced, the integration degree may be further increased. Furthermore, since the bit line is interposed between the variable resistance element and the selecting element, a separate intermediate electrode does not need to be formed. Thus, the fabrication process may be further simplified. As a result, when the memory device is fabricated, the cost may be reduced, and the integration degree of the memory device may be increased.

Furthermore, because an appropriate voltage is applied to two bit lines, the operating characteristic of the memory device may be properly maintained even though the selecting element interposed between two bit lines is shared by two memory cells (one at the top, and the other at the bottom).

In the above-described memory device, the shapes of the first variable resistance element 120, the first selecting element 140, and the second variable resistance element 160, are not limited to the island shape as illustrated in FIG. 1, but may have various shape (such as a line shape or a plate shape). The first variable resistance element 120, the first selecting element 140, and the second variable resistance element 160 may perform their roles at the intersection among the first word line 110, the first bit line 130, the second bit line 150, and the second word line 170, regardless of the shapes of the first variable resistance element 120, the first selecting element 140, and the second variable resistance element 160. Hereafter, another embodiment will be described with reference to FIGS. 6 to 9.

Figure 6:
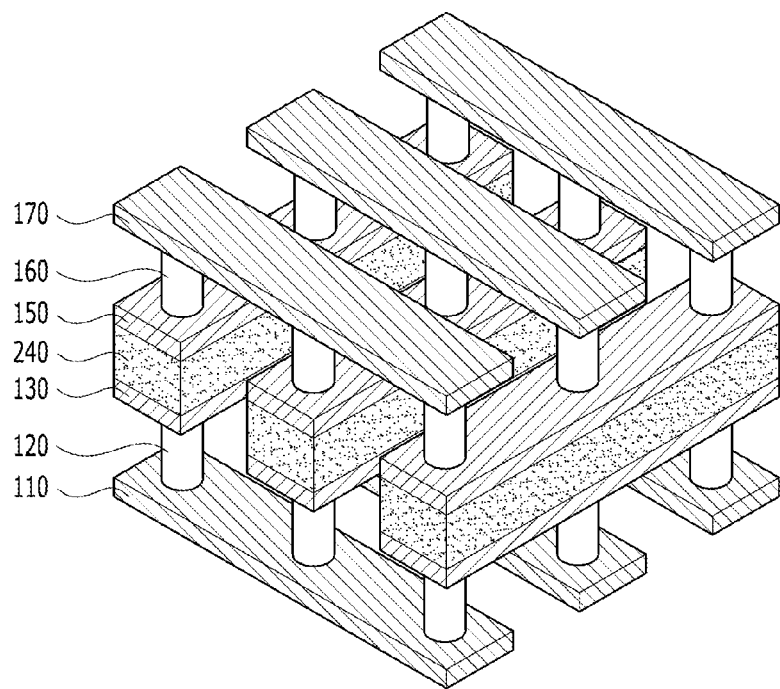
FIG. 6 is a perspective view of an embodiment of a memory device in accordance with a particular implementation.

FIG. 6 is a perspective view of a memory device in accordance with an implementation.

Referring to FIG. 6, the embodiment of the memory device in accordance with that implementation may include a first selecting element layer 240 interposed between the first bit line 130 and the second bit line 150 and having a line shape as the first bit line 130 and/or the second bit line 150 (unlike the memory device embodiment of FIG. 1). The first selecting element layer 240 may be formed of the same material as the above-described first selecting element 140.

Although the first selecting element layer 240 has a line shape, the first selecting element layer 240 may function as a selecting element at the intersection among the first word line 110, the first bit line 130, the second bit line 150, and the second word line 170. Thus, the memory device may have substantially a same operation characteristic as the memory device of FIG. 1.

When the first selecting element layer 240 has the same line shape as the first bit line 130, the first selecting element layer 240 and the first bit line 130 may be patterned together. Thus, the fabrication process may be further simplified. When the first selecting element layer 240 has the same line shape as the second bit line 150, the first selecting element layer 240 and the second bit line 150 may be patterned together, and the fabrication process may be further simplified. When the first selecting element 240 has the same line shape as the first and second bit lines 130 and 150, the first selecting element layer 240, the first bit line 130, and the second bit line 150 may be patterned together. Thus, the fabrication process may be further simplified.

Figure 7:
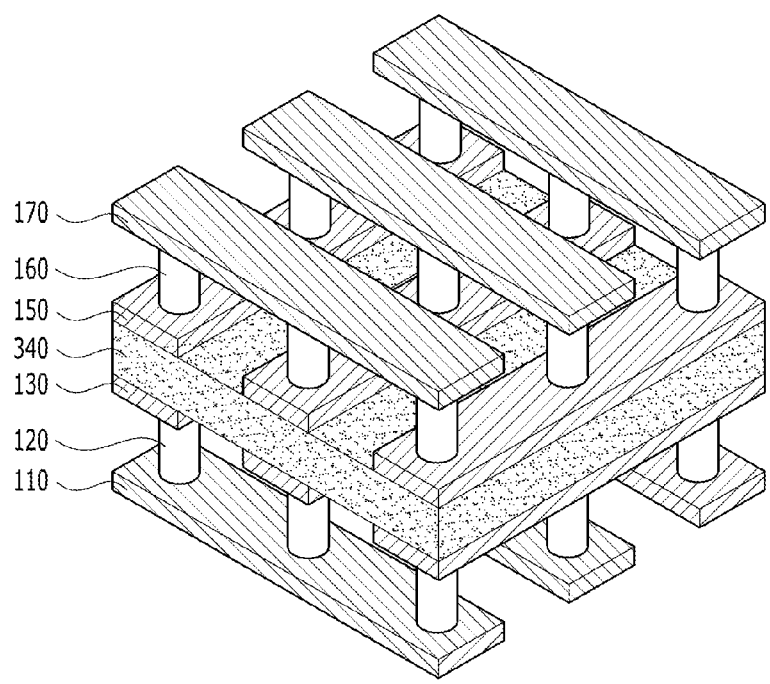
FIG. 7 is a perspective view of an embodiment of a memory device in accordance with a particular implementation.

FIG. 7 is a perspective view of an embodiment of a memory device in accordance with another implementation.

Referring to FIG. 7, the memory device in accordance with that implementation may include a first selecting element layer 240 interposed between the first bit line 130 and the second bit line 150 and having a plate shape (unlike the memory device of FIG. 1). The first selecting element layer 340 may be formed of the same material as the first selecting element 140.

Although the first selecting element layer 340 has a plate shape, the first selecting element layer 340 may function as a selecting element at the intersection among the first word line 110, the first bit line 130, the second bit line 150, and the second word line 170. Thus, the memory device in accordance with the present implementation may have substantially the same operating characteristic as the memory device of FIG. 1.

When the first selecting element layer 340 has a plate shape, a patterning process may be unnecessary as to the first selecting element layer 340, or may be performed using a relatively large mask. Thus, the fabrication process may be simplified and/or a level of process difficulty or complexity may be reduced.

Figure 8:
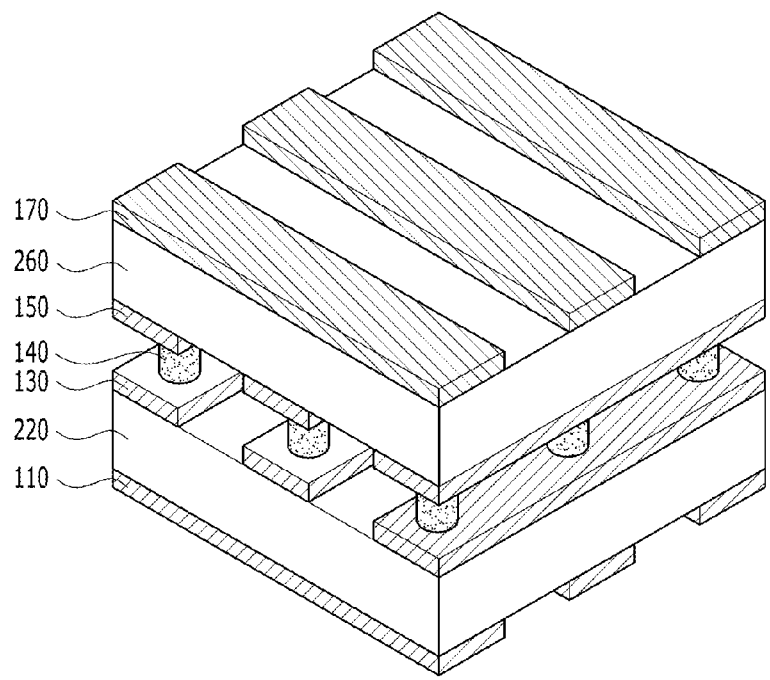
FIG. 8 is a perspective view of an embodiment of a memory device in accordance with a particular implementation.

FIG. 8 is a perspective view of an embodiment of a memory device in accordance with another implementation.

Referring to FIG. 8, the memory device in accordance with that implementation may include a plate-shaped first variable resistance layer 220 interposed between the first word line 110 and the first bit line 130 and a plate-shaped second variable resistance layer 260 interposed between the second bit line 150 and the second word line 170, unlike the memory device of FIG. 1. FIG. 8 illustrates that both of the first and second variable resistance layers 220 and 260 have a plate shape. In another implementation, however, one of the first and second variable resistance layers 220 and 260 may have a plate shape, and the other may have a different shape (for example the island shape of FIG. 1, or the line shape of FIG. 9). The first and second variable resistance layers 220 and 260 may be formed of the same materials as the first and second variable resistance elements 120 and 160, respectively.

Although the first and second variable resistance layers 220 and 260 have a plate shape, the first and second variable resistance layers 220 and 260 may perform the same function as a variable resistance element at the intersection among the first word line 110, the first bit line 130, the second bit line 150, and the second word line 170. Thus, the memory device in accordance with this implementation may have substantially the same operating characteristic as the memory device of FIG. 1.

When the first and second variable resistance layers 220 and 260 have a plate shape, a patterning process may not be necessary as to the first and second variable resistance layers 220 and 260 or may be performed using a relatively large mask. Thus, the fabrication process may be simplified and/or the patterning process may be performed more easily.

Figure 9:
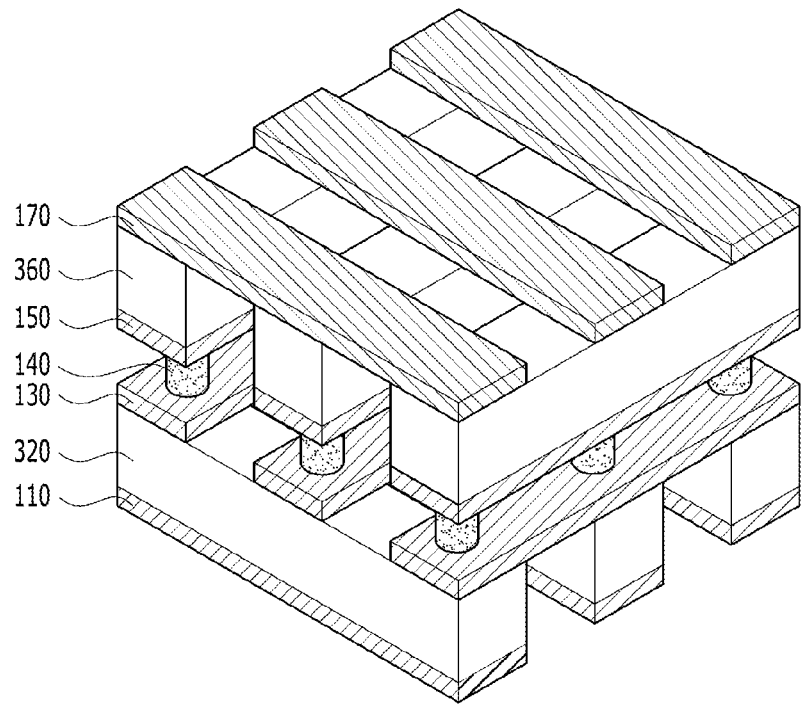
FIG. 9 is a perspective view of an embodiment of a memory device in accordance with a particular implementation.

FIG. 9 is a perspective view of an embodiment of a memory device in accordance with another implementation.

Referring to FIG. 9, the memory device in accordance with that implementation may include a first variable resistance layer 320 interposed between the first word line 110 and the first bit line 130 and having a line shape as same as any one of the first word line 110 and the first bit line 130. Likewise, a second variable resistance layer 360 interposed between the second bit line 150 and the second word line 170 has a line shape as same as any one of the second bit line 150 and the second word line 170, unlike the memory device of FIG. 1. FIG. 9 illustrates that the first variable resistance layer 320 has the same line shape as the first word line 110. In another implementation, however, the first variable resistance layer 320 may have the same shape as the first bit line 130. Furthermore, FIG. 9 illustrates that the second variable resistance layer 360 has the same shape as the second bit line 150. In another implementation, however, the second variable resistance layer 360 may have the same shape as the second word line 170.

Although the first and second variable resistance layers 320 and 360 have such a line shape, the first and second variable resistance layers 320 and 360 may perform the same function as a variable resistance element at the intersection among the first word line 110, the first bit line 130, the second bit line 150, and the second word line 170. Thus, the memory device in accordance with this implementation may have the same operating characteristic as the memory device of FIG. 1.

When the first variable resistance layer 320 has the same shape as any one of the first word line 110 and the first bit line 130, the first variable resistance layer 320 may be patterned together with the line. Thus, the fabrication process may be further simplified. Furthermore, when the second variable resistance layer 360 has the same shape as any one of the second word line 170 and the second bit line 150, the second variable resistance layer 360 may be patterned together with the line. Thus, the fabrication process may be further simplified.

Referring to FIGS. 1, 6, and 9, the shapes of the variable resistance layers and the shape of the first selecting element layer are combined in various manners. Embodiments are not limited thereto and specific combinations not illustrated in the corresponding drawings can be employed. For example, the first variable resistance layer may have an island shape, a same shape as the word line, a same shape as the bit line, or a plate shape (four cases). The second variable resistance layer may have an island shape, a same shape as the word line, a same shape as the bit line, or a plate shape (four cases). The first selecting element layers may have an island shape, a same shape as the bit line, or a plate shape (three cases). As a result, at least forty-eight (48=4*4*3) combinations of memory devices may be provided.

In the above-described implementations, the first bit line 130 and the second bit line 150 may be electrically isolated from each other and separately controlled. However, since the first bit line 130 and the second bit line 150 overlap each other in an array region where memory cells are arranged, end parts of the first and second bit lines 130 and 150 may have a step-shaped structure so as to secure a formation region of contacts. The contacts are coupled to the first bit line 130 and the second bit line 150, respectively, at a region outside the array region (hereafter, an outer region). An example of such a structure is now described with reference to FIG. 10.

Figure 10:
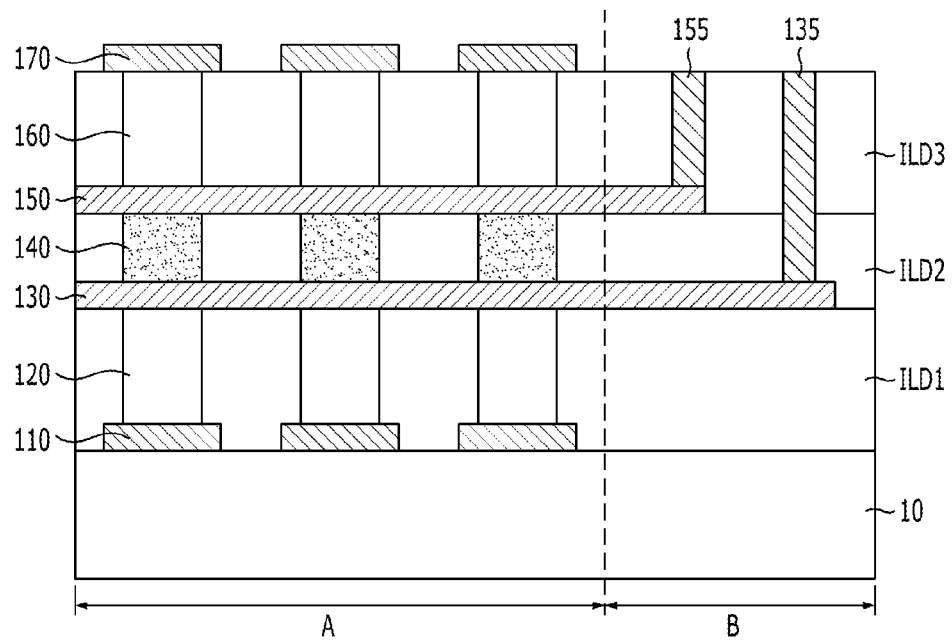
FIG. 10 is a cross-sectional view of an embodiment of a memory device in accordance with a particular implementation.

FIG. 10 is a cross-sectional view of an embodiment of a memory device in accordance with another implementation, taken along the second direction.

Referring to FIG. 10, the same structure as described with reference to FIG. 1 may be formed in an array region A. The shapes of the first and second variable resistance elements 120 and 160 of the array region A and the shape of the selecting element 140 are not limited to those illustrated in FIG. 10. The shapes may be modified in various manners as described above.

The first and second bit lines 130 and 150 of the array region A may extending the second direction so as to reach the outer region B. At the outer region B, the end parts of the first and second bit lines 130 and 150 may have a step-shaped structure. In other words, the first bit line 130 positioned at the lower side may extend further in the second direction than the second bit line 150 positioned at the upper side.

A first contact 135 may be coupled to the end part of the first bit line 130 extending further than the second bit line 150, through interlayer dielectric layers ILD2 and ILD3 positioned over the first bit line 130. Thus, the first contact 135 may couple the first bit line 130 and a first wiring (not illustrated). A second contact 155 may be coupled to the end part of the second bit line 150 through the interlayer dielectric layer ILD3 positioned over the second bit line 150. Thus, the second contact 155 may couple the second bit line 150 and a second wiring (not illustrated).

In the above-described implementations, two or more structures (each including the first stacked structure ST1, the second stacked structure ST2, and the first selecting element 140 interposed therebetween) may be repetitively stacked over the substrate. The structure positioned in a bottom and top direction may share a word line. In other words, in a top-bottom structure pair, an upper word line of the bottom structure may function as a lower word line of the top structure. This will be described below with reference to FIG. 11.

Figure 11:
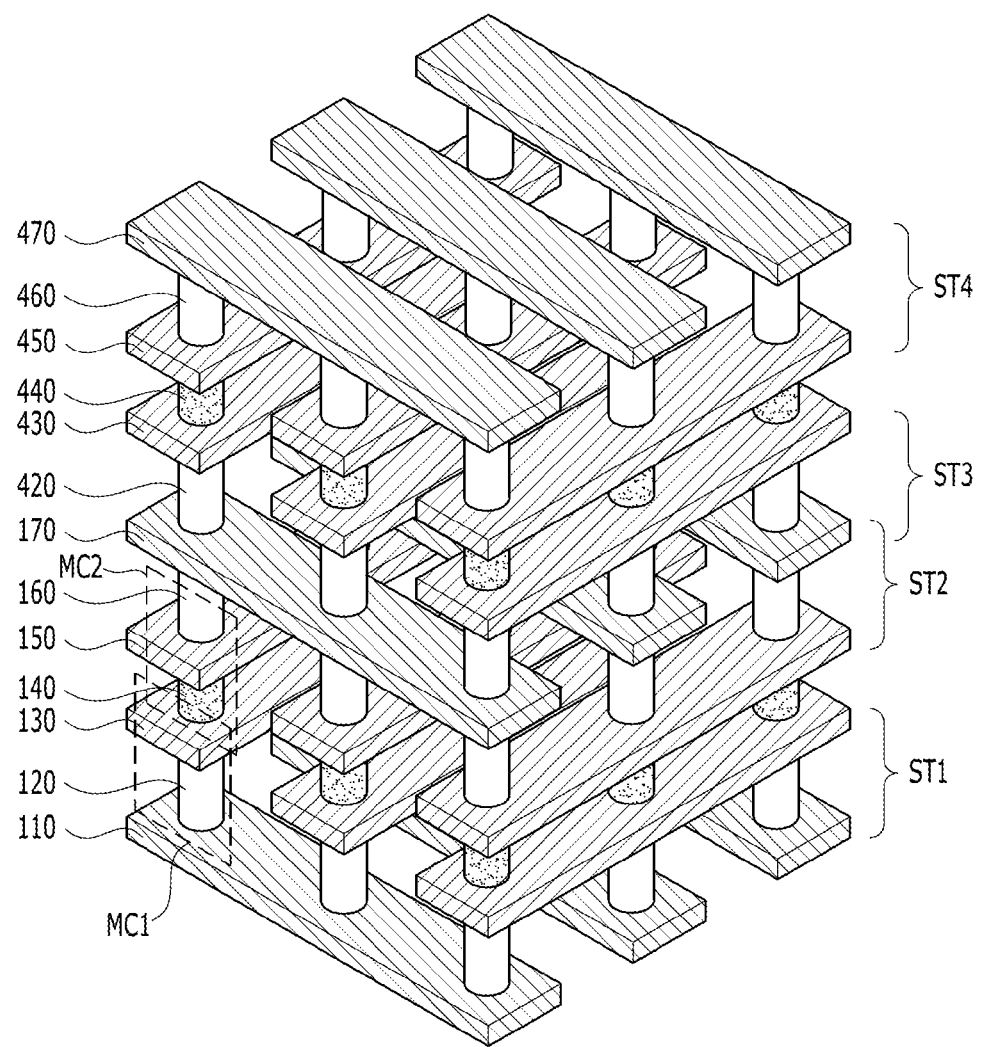
FIG. 11 is a perspective view of an embodiment of a memory device in accordance with a particular implementation.

FIG. 11 is a perspective view of an embodiment of a memory device in accordance with another implementation. FIG. 11 illustrates that two structures (each including the first stacked structure ST1 and the second stacked structure ST2, respectively, and sharing the first selecting element 140 interposed therebetween), are stacked.

Referring to FIG. 11, the memory device may further include a third stacked structure ST3, a second selecting element 440, and a fourth stacked structure ST4, which are disposed over the first stacked structure ST1, the first selecting element 140, and the second stacked structure ST2 of FIG. 1. The third stacked structure ST3 may share the second word line 170 with the second stacked structure ST2, while having a similar structure to the first stacked structure ST1. That is, the third stacked structure ST3 may include the second word line 170, a third bit line 430, and a third variable resistance element 420 interposed therebetween. The fourth stacked structure ST4 may have a similar structure to the second stacked structure ST2. That is, the fourth stacked structure ST4 may include a fourth bit line 450, a third word line 470, and a fourth variable resistance element 460 interposed therebetween. The second selecting element 440 may be interposed between the third bit line 430 and the fourth bit line 450.

Although not illustrated, end parts of the first to fourth bit lines 130, 150, 430, and 450 may have a step shape in a similar manner as described with reference to FIG. 10.

Furthermore, three or more structures each including the first stacked structure ST1, the second stacked structure ST2, and the first selecting element 140 interposed therebetween may be stacked to further increase the integration degree of the memory device.

According to various embodiments, the difficulty level of the fabrication process may be reduced, and the fabrication process may be simplified. Thus, the cost may be reduced, and an integration degree may be increased.

The above and other memory circuits or semiconductor devices based on the disclosed technology can be used in a variety of devices or systems. FIGS. 12-16 provide some examples of devices or systems that can implement the memory circuits disclosed herein.

Figure 12:
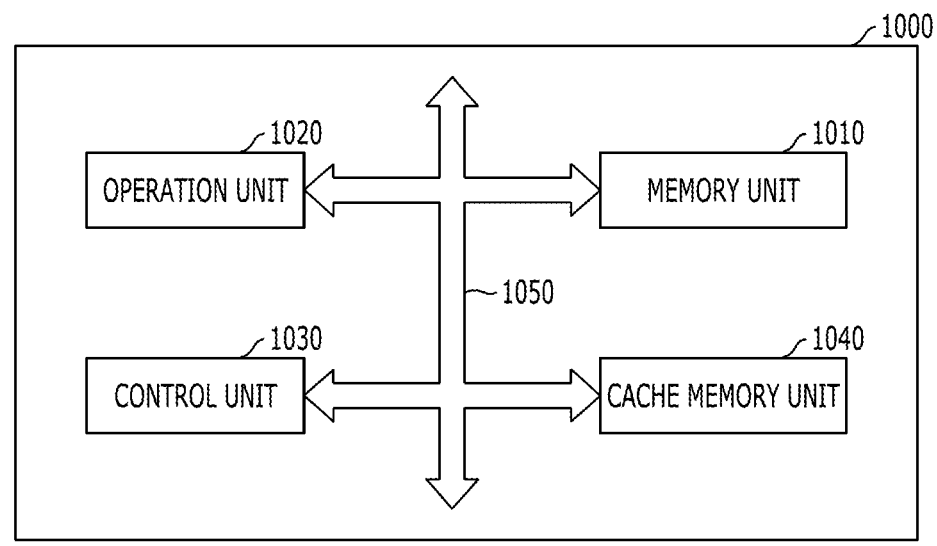
FIG. 12 is an example of configuration diagram of a microprocessor employing memory circuitry in accordance with an embodiment.

FIG. 12 is an example of configuration diagram of a microprocessor implementing memory circuitry.

Referring to FIG. 12, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 stores data in the microprocessor 1000, a processor register, or the like. The memory unit 1010 may include a data register, an address register, a floating point register and so on. Besides, the memory unit 1010 may include various other registers. The memory unit 1010 may temporarily store: data necessary for operations of the operation unit 1020; result data of performing the operations; and addresses designating a location where the data necessary for the operations are stored.

The memory unit 1010 may include one or more of the above-described embodiments of the semiconductor devices in accordance with the implementations. For example, the memory unit 1010 may include a first stacked structure comprising a first word line disposed over a substrate and extended in a first direction, a first bit line disposed over the first word line and extended in a second direction crossing the first direction, and a first variable resistance layer interposed between the first word line and the first bit line; and a second stacked structure comprising a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line. Through this, the fabricating cost of the memory unit 1010 may be reduced, and the integration degree of the memory unit 1010 may be increased. As a consequence, a fabricating cost of the microprocessor 1000 may be reduced, and the size of the microprocessor 1000 may be reduced.

The operation unit 1020 may perform four arithmetical operations or logical operations according to commands decoded by the control unit 1030. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling of input and output signals of the microprocessor 1000, and execute processing represented by programs.

The microprocessor 1000 may additionally include a cache memory unit 1040 which can temporarily store data received from an external device other than the memory unit 1010 or transmitted to an external device. In this case, the cache memory unit 1040 may exchange data with the memory unit 1010, the operation unit 1020 and the control unit 1030 through a bus interface 1050.

Figure 13:
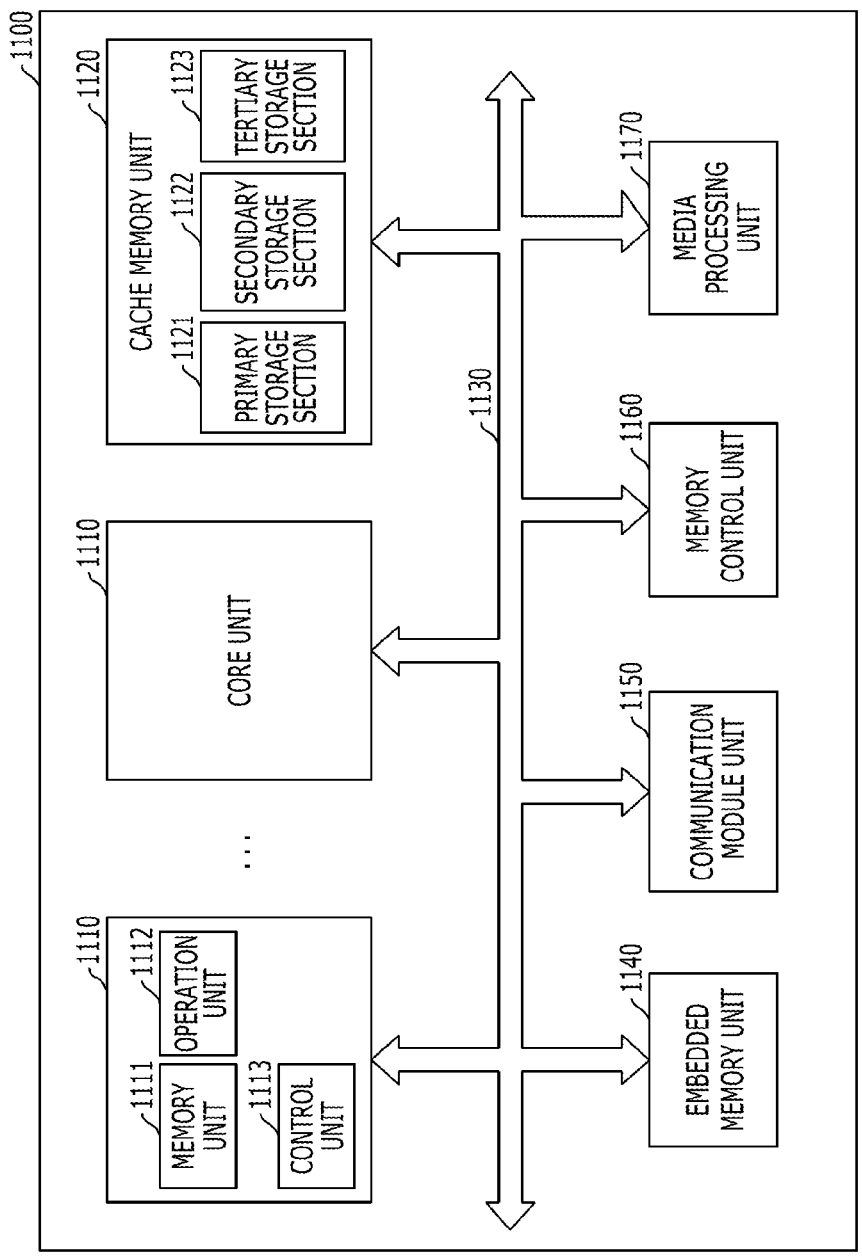
FIG. 13 is an example of configuration diagram of a processor employing memory circuitry in accordance with an embodiment.

FIG. 13 is an example of configuration diagram of a processor implementing memory circuitry according to an implementation.

Referring to FIG. 13, a processor 1100 may improve performance and realize multi-functionality by including various functions in addition to a function performed by a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to store data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 performs arithmetic logic operations using data inputted from an external device, and may include a memory unit 1111, an operation unit 1112 and a control unit 1113.

The memory unit 1111 is stores data in the processor 1100, a processor register, a register or the like. The memory unit 1111 may include a data register, an address register, a floating point register and so on. Besides, the memory unit 1111 may include other various registers. The memory unit 1111 may perform the function of temporarily storing data necessary for operations of the operation unit 1112, result data of performing the operations and addresses where data for performing of the operations are stored. The operation unit 1112 performs operations in the processor 1100. The operation unit 1112 may perform four arithmetical operations, logical operations, according to commands decoded by the control unit 1113, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output signals of processor 1100, and execute processing represented by programs.

The cache memory unit 1120 temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. When necessary, the cache memory unit 1120 may include an increased number of storage sections. That is to say, the number of storage sections which are included in the cache memory unit 1120 may be changed according to a design. The speeds at which the primary, secondary, and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described embodiments of semiconductor devices in accordance with implementations. For example, the cache memory unit 1120 may include a first stacked structure comprising a first word line disposed over a substrate and extended in a first direction, a first bit line disposed over the first word line and extended in a second direction crossing the first direction, and a first variable resistance layer interposed between the first word line and the first bit line; and a second stacked structure comprising a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line. Through this, the fabricating cost of the cache memory unit 1120 may be reduced, and the integration degree of the cache memory unit 1120 may be increased. As a consequence, a fabricating cost of the processor 1100 may be reduced, and the size of the processor 1100 may be reduced.

Although it was shown in FIG. 13 that all the primary, secondary and tertiary storage sections 1121, 1122, and 1123 are configured inside the cache memory unit 1120, it is to be noted that all the primary, secondary and tertiary storage sections 1121, 1122, and 1123 of the cache memory unit 1120 may be provided outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In an implementation, the primary and secondary storage sections 1121, 1122 may be disposed inside the core units 1110 and tertiary storage sections 1123 may be disposed outside of the core units 1110.

The bus interface 1130 connects the core unit 1110, the cache memory unit 1120, and external device, and allows data to be efficiently transmitted.

The processor 1100 according to embodiments may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In an implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of other various modules and devices. The plurality of modules which are added may exchange data with the core units 1110 and the cache memory unit 1120 with one another, through the bus interface 1130.

The embedded memory unit 1140 may include not only a volatile memory, but also a nonvolatile memory. The volatile memory may include a DRAM (dynamic random access memory), a mobile DRAM, a SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network, and a module capable of being connected with both of them. The module may include a local area network (LAN), a universal serial bus (USB), an Ethernet, power line communication (PLC) such as various devices which send and receive data through transmit lines, and so on. The network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 administrates and processes data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 14:
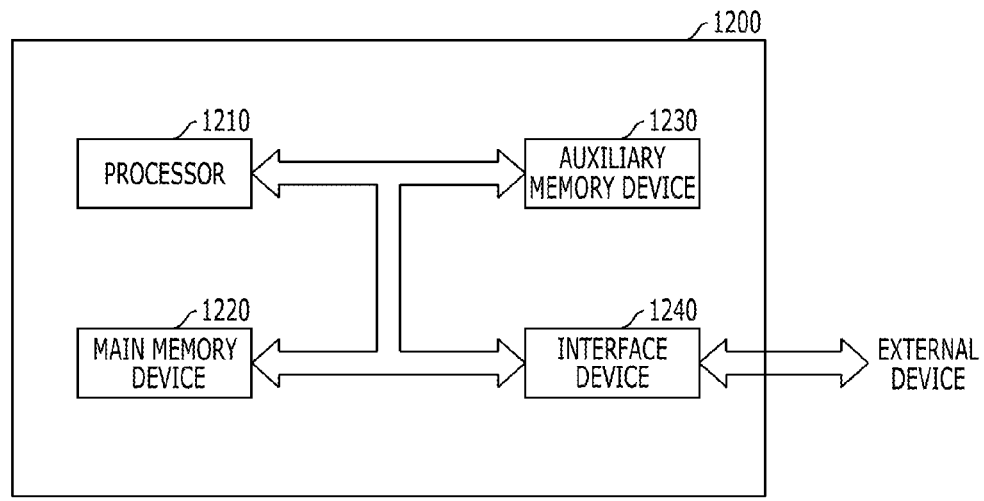
FIG. 14 is an example of configuration diagram of a system employing memory circuitry in accordance with an embodiment.

FIG. 14 is an example of configuration diagram of a system implementing memory circuitry.

Referring to FIG. 14, a system 1200 as an apparatus for processing data may perform the functions of input, processing, output, communication, storage, etc. to conduct a series of manipulations upon data. The system 1200 may include a processor 1210, a main memory device 1220, an auxiliary memory device 1230, an interface device 1240, and so on. The system 1200 may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and perform operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can retain memorized contents even when power supply is cut off. The main memory device 1220 may include one or more of the above-described semiconductor devices in accordance with the implementations. For example, the main memory device 1220 may include a first stacked structure comprising a first word line disposed over a substrate and extended in a first direction, a first bit line disposed over the first word line and extended in a second direction crossing the first direction, and a first variable resistance layer interposed between the first word line and the first bit line; and a second stacked structure comprising a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line. Through this, the fabricating cost of the main memory device 1220 may be reduced, and the integration degree of the main memory device 1220 may be increased. As a consequence, a fabricating cost of the system 1200 may be reduced, and the size of the system 1200 may be reduced.

Also, the main memory device 1220 may further include a volatile memory such as a static random access memory (SRAM), a dynamic random access memory (DRAM), and so on. In the volatile memory, all contents are erased when power supply is cut off. Unlike this, the main memory device 1220 may not include the semiconductor devices according to the implementations, but may include the volatile memory such as a static random access memory (SRAM), a dynamic random access memory (DRAM), and so on. In the volatile memory, all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described embodiments of semiconductor devices in accordance with the implementations. For example, the auxiliary memory device 1230 may include a first stacked structure comprising a first word line disposed over a substrate and extended in a first direction, a first bit line disposed over the first word line and extended in a second direction crossing the first direction, and a first variable resistance layer interposed between the first word line and the first bit line; and a second stacked structure comprising a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line. Through this, the fabricating cost of the auxiliary memory device 1230 may be reduced, and the integration degree of the auxiliary memory device 1230 may be increased. As a consequence, a fabricating cost of the system 1200 may be reduced, and the size of the system 1200 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 15:
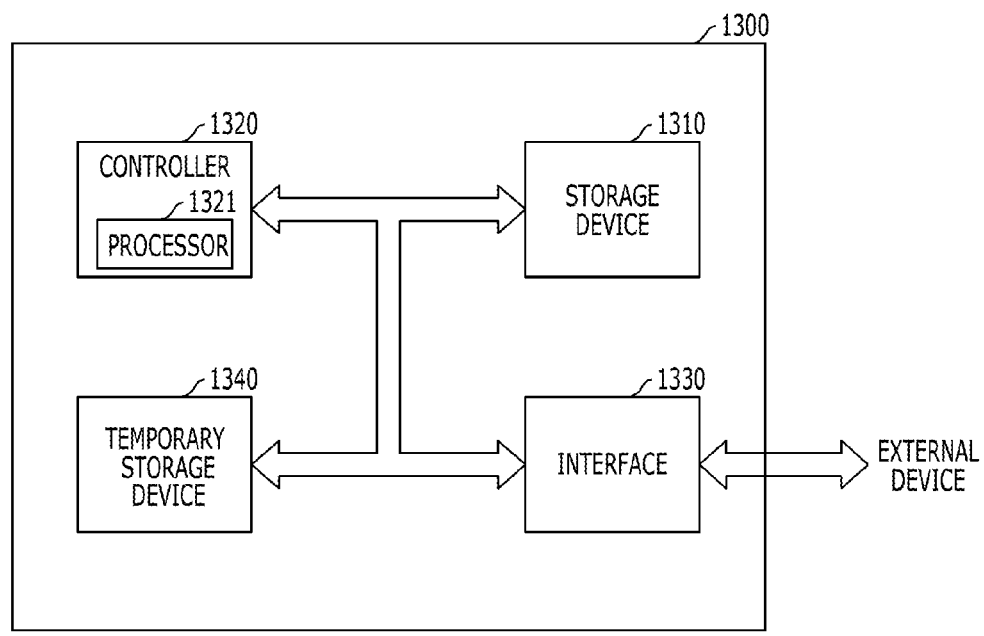
FIG. 15 is an example of configuration diagram of a data storage system employing memory circuitry in accordance with an embodiment.

FIG. 15 is an example of configuration diagram of a data storage system implementing memory circuitry.

Referring to FIG. 15, a data storage system 1300 may include a storage device 1310 which has a nonvolatile characteristic and may be a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first stacked structure comprising a first word line disposed over a substrate and extended in a first direction, a first bit line disposed over the first word line and extended in a second direction crossing the first direction, and a first variable resistance layer interposed between the first word line and the first bit line; and a second stacked structure comprising a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line. Through this, the fabricating cost of the temporary storage device 1340 may be reduced, and the integration degree of the temporary storage device 1340 may be increased. As a consequence, a fabricating cost of the data storage system 1300 may be reduced, and the size of the data storage system 1300 may be reduced.

Figure 16:
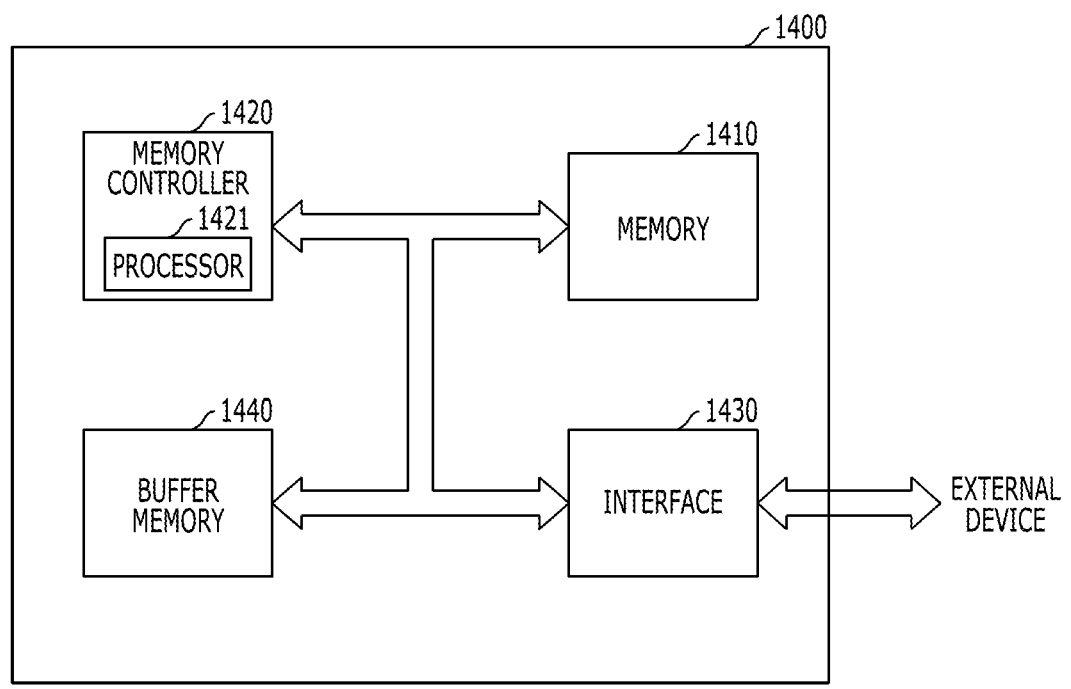
FIG. 16 is an example of configuration diagram of a memory system employing memory circuitry in accordance with an embodiment.

FIG. 16 is an example of configuration diagram of a memory system implementing memory circuitry.

Referring to FIG. 16, a memory system 1400 may include a memory 1410 which has a nonvolatile characteristic and may be a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first stacked structure comprising a first word line disposed over a substrate and extended in a first direction, a first bit line disposed over the first word line and extended in a second direction crossing the first direction, and a first variable resistance layer interposed between the first word line and the first bit line; and a second stacked structure comprising a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line. Through this, the fabricating cost of the memory 1410 may be reduced, and the integration degree of the memory 1410 may be increased. As a consequence, a fabricating cost of the memory system 1400 may be reduced, and the size of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 performs exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first stacked structure comprising a first word line disposed over a substrate and extended in a first direction, a first bit line disposed over the first word line and extended in a second direction crossing the first direction, and a first variable resistance layer interposed between the first word line and the first bit line; and a second stacked structure comprising a second bit line disposed over the first stacked structure and extended in the second direction, a second word line disposed over the second bit line and extended in the first direction, and a second variable resistance layer interposed between the second word line and the second bit line; and a first selecting element layer interposed between the first bit line and the second bit line. Through this, the fabricating cost of the buffer memory 1440 may be reduced, and the integration degree of the buffer memory 1440 may be increased. As a consequence, a fabricating cost of the memory system 1400 may be reduced, and the size of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include a volatile memory such as an SRAM (static random access memory), a DRAM (dynamic random access memory), and so on, or a non-volatile memory such as a phase change random access memory (PRAM), a resistive random access memory (RRAM), a spin transfer torque random access memory (STTRAM), a magnetic random access memory (MRAM), and so on.

As is apparent from the above descriptions, in the semiconductor device and the method for fabricating the same in accordance with the implementations, patterning of a resistance variable element is facilitated, and it is possible to secure the characteristics of the resistance variable element.

Features in the above examples of electronic devices or systems in FIGS. 12-16 based on the memory devices, may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

Certain features described in the context of separate embodiments or implementations can also be implemented in combination in a single embodiment. Various features that are described in the context of a single embodiment or implementation can also be implemented in multiple embodiments separately or in suitable subcombinations. Moreover, one or more features can in some cases be derived from a combination, and such combination may exhibit a subcombination or variation of a subcombination.

Similarly, while operations are depicted in the drawings in a particular order, this should not be understood as requiring that such operations be performed in the particular order shown or in sequential order, or that all illustrated operations must be performed, to achieve desirable results. Moreover, the separation of various system components in the embodiments should not be understood as requiring such separation in all embodiments.

Only certain embodiments, implementations, and examples are explicitly described above. Other embodiments, implementations, enhancements, and variations are possible.

What is claimed is:

1. An electronic device comprising a semiconductor memory,
   wherein the semiconductor memory comprises:
      a first stacked structure comprising a first word line disposed over a substrate and extended in a first direction, a first bit line disposed over the first word line and extended in a second direction crossing the first direction, and a first variable resistance layer interposed between the first word line and the first bit line; and
      a second stacked structure comprising a second bit line disposed over the first stacked structure and extended in the second direction, a second word line disposed over the second bit line and extended in the first direction, and a second variable resistance layer interposed between the second word line and the second bit line; and
      a first selecting element layer interposed between the first bit line and the second bit line: and
      wherein the first variable resistance layer and the first selecting element layer form a first memory cell, and
      wherein the second variable resistance layer and the first selecting element layer form a second memory cell.

2. The electronic device of claim 1, wherein the first memory cell is controlled by the first word line and the second bit line, and wherein the second memory cell is controlled by the second word line and the first bit line.

3. The electronic device of claim 2, wherein the first bit line is floated when the first memory cell is controlled, and wherein the second bit line is floated when the second memory cell is controlled.

4. The electronic device of claim 1, wherein the first selecting element layer is formed of $NbO_2$.

5. The electronic device of claim 1, wherein each of the first variable resistance layer and the second variable resistance layer comprises a structure in which an oxygen-poor metal oxide layer and an oxygen-rich metal oxide layer are stacked, and
   wherein the first variable resistance layer and the second variable resistance layer are arranged symmetrical with each other with respect to the first selecting element layer interposed therebetween.

6. The electronic device of claim 1, wherein the first variable resistance layer has an island shape at an intersection between the first word line and the first bit line.

7. The electronic device of claim 1, wherein the first variable resistance layer has a line shape and extends in a same direction as the first word line or as the first bit line.

8. The electronic device of claim 1, wherein the second variable resistance layer has an island shape at an intersection between the second word line and the second bit line.

9. The electronic device of claim 1, wherein the second variable resistance layer has a line shape and extends in a same direction as the second word line or as the second bit line.

10. The electronic device of claim 1, wherein the first selecting element layer has an island shape while overlapping an intersection between the first bit line and the first word line and an intersection between the second bit line and the second word line.

11. The electronic device of claim 1, wherein the first selecting element layer has a line shape and extends in a same direction as at least one of the first bit line and the second bit line.

12. The electronic device of claim 1, wherein one or more of the first variable resistance layer, the second variable resistance layer, and the first selecting element have a plate shape.

13. The electronic device of claim 1, wherein an end part of the first bit line extends in the second direction further than an end part of the second bit line, and
wherein the semiconductor memory further comprises:
a first contact disposed over the protruding end part of the first bit line so as to be coupled to the first bit line; and
a second contact disposed over the end part of the second bit line so as to be coupled to the second bit line.

14. The electronic device of claim 1, wherein the semiconductor memory further comprises:
a third stacked structure disposed over the second stacked structure and comprising the second word line, a third bit line disposed over the second word line and extended in the second direction, and a third variable resistance layer interposed between the second word line and the third bit line;
a fourth stacked structure disposed over the third stacked structure, and comprising a fourth bit line extended in the second direction, a third word line disposed over the fourth bit line and extended in the first direction, and a fourth variable resistance layer interposed between the third word line and the fourth bit line; and
a second selecting element layer interposed between the third stacked structure and the fourth stacked structure.

15. The electronic device according to claim 1, further comprising a microprocessor which includes:
a control unit configured to receive a signal including a command from an outside of the microprocessor, and performs extracting, decoding of the command, or controlling of input or output signal of the microprocessor;
an operation unit configured to perform an operation in response to a result from the control unit which decodes the command; and
a memory unit configured to store data for performing the operation, data generated as a result of the operation, or an address of data designating a location where any of the data for performing the operation and the data corresponding to the result of the operation is stored, and
wherein the semiconductor memory is part of the memory unit in the microprocessor.

16. The electronic device according to claim 1, further comprising a processor which includes:
a core unit configured to perform, in response to a command inputted from an outside of the processor, an operation corresponding to the command;
a cache memory unit configured to store data for performing the operation, data generated as a result of the operation, or an address designating a location where any of the data for performing the operation and the data generated as a result of the operation is stored; and
a bus interface connected between the core unit and the cache memory unit and configured to transmit data between the core unit and the cache memory unit,
wherein the semiconductor memory is part of the cache memory unit in the processor.

17. The electronic device according to claim 1, further comprising a processing system which includes:
a processor configured to decode a command received by the processor and control an operation for information in response to the decoded command;
an auxiliary memory device configured to store a program for decoding the command and the information;
a main memory device configured to call and store the program and the information from the auxiliary memory device such that the processor can perform the operation using the program and the information when the program is executed; and
an interface device configured to perform communication between at least one of the processor, the auxiliary memory device, and the main memory device and the outside,
wherein the semiconductor memory is part of the auxiliary memory device or the main memory device in the processing system.

18. The electronic device according to claim 1, further comprising a data storage system which includes:
a storage device configured to store data and retain stored data regardless of power supply;
a controller configured to control input and output data to and from the storage device according to a command inputted form an outside;
a temporary storage device configured to temporarily store data exchanged between the storage device and the outside; and
an interface configured to perform communication among the storage device, the controller, the temporary storage device, and the outside,
wherein the semiconductor memory is part of the storage device or the temporary storage device in the data storage system.

19. The electronic device according to claim 1, further comprising a memory system which includes:
a memory configured to store data and retain stored data regardless of power supply;
a memory controller configured to control input and output data to and from the memory according to a command inputted form an outside;
a buffer memory configured to buffer data exchanged between the memory and the outside; and
an interface configured to perform communication among the memory, the memory controller, the buffer memory, and the outside,
wherein the semiconductor memory is part of the memory or the buffer memory in the memory system.

20. An electronic device comprising a semiconductor memory,
wherein the semiconductor memory comprises:
first and second word lines extended in a first direction;

first and second bit lines extended in a second direction crossing the first direction;
a first variable resistance element coupled to the first word line and the first bit line;
a second variable resistance element coupled to the second word line and the second bit line; and
a selecting element coupled between the first bit line and the second bit line so that the selecting element is coupled in series to the first variable resistance element and to the second variable resistance element; and
wherein the first variable resistance element and the selecting element form a first memory cell, and wherein the second variable resistance element and the selecting element form a second memory cell.

21. The electronic device of claim 20, wherein the first memory cell is controlled by the first word line and the second bit line, and wherein the second memory cell is controlled by the second word line and the first bit line.

22. The electronic device of claim 21, wherein the first bit line is floated when the first memory cell is controlled, and wherein the second bit line is floated when the second memory cell is controlled.

* * * * *